METHOD OF DOPING SEMICONDUCTOR SUBSTRATES

Filed May 3, 1971 2 Sheets-Sheet 1

INVENTORS
Robert G. Hays
Ronald C. Pennell
Edwin E. Reed
Charles E. Volk
BY
ATTY'S

METHOD OF DOPING SEMICONDUCTOR SUBSTRATES

Filed May 3, 1971 2 Sheets-Sheet 2

TIME DEPENDENCE FOR SURFACE CONCENTRATION

PRESSURE DEPENDENCE FOR SURFACE CONCENTRATION CONTROL

INVENTORS
Robert G. Hays
Ronald C. Pennell
Edwin E. Reed
Charles E. Volk

BY [illegible signature] ATTY'S

United States Patent Office 3,690,969

Patented Sept. 12, 1972

3,690,969

METHOD OF DOPING SEMICONDUCTOR SUBSTRATES

Robert Guy Hays, Scottsdale, Ronald Charles Pennell, Mesa, and Edwin Emmett Reed and Charles Edward Volk, Scottsdale, Ariz., assignors to Motorola, Inc., Franklin Park, Ill.

Filed May 3, 1971, Ser. No. 139,505
Int. Cl. H01l 7/34
U.S. Cl. 148—188 10 Claims

ABSTRACT OF THE DISCLOSURE

There is disclosed a method of controlling surface dopant concentration in a semiconductor material in which the dopant is diffused from a doped oxide source. The method involves the use of an oxidizing ambient during the doping operation which creates a growing interface oxide barrier to moderate the doping of the substrate. Control of the process is obtained by adjusting the partial pressure of the oxidant and by controlling the amount of time the semiconductor material is kept in the diffusion chamber. This process permits the use of a standard highly doped oxide coating to achieve different and controllable surface concentrations of dopants diffused from the doped oxide into the semiconductor material by controlling the rate of growth of the interface oxide barrier which results from the use of the oxidizing ambient.

BACKGROUND

This invention relates to the production of semiconductor devices and more particularly to a method for controlling the surface concentration of a dopant diffused into a semiconductor material from a doped oxide source.

In the past, doped oxide layers on top of semiconductor substrates have been utilized as a doping source for the substrates. In these processes the coated substrate is subjected to high temperatures in an inert atmosphere for a predetermined length of time. This results in the diffusion of doping atoms from the doped oxide into the semiconductor substrate. Heretofore the concentrations of the dopant in the semiconductor substrate was controlled primarily by the doping concentration level in the doped oxide. Unfortunately, by this process, the surface concentration of the dopant cannot be varied except by changing this doped oxide dopant level. Controlled surface concentrations are important, not only in bipolar semiconductor devices but also in field effect transistors and in metal oxide semiconductor (MOS) devices. Accurate control of the surface concentration has been attempted by forming an interface oxide barrier, which is not initially doped, between the doped oxide and the semiconductor substrate. This interface oxide is formed as a layer on the substrate prior to the deposition of the doped oxide. It happens by controlling the initial thickness of this interface oxide barrier that the doping concentration can be reduced in a known manner by controlling the initial doping concentration in the doped oxide itself. In general, in these prior art systems, a suitably tailored doped oxide and/or a fixed thickness interface oxide barrier had to be provided for each individual case in order to obtain the required surface concentration in the semiconductor substrate. It was apparent that if each individual doped oxide layer had to be prepared separately, automation of the doping process could not easily be achieved.

It has been found that by replacing the usual inert atmosphere in the diffusion chamber with an oxidizing atmosphere that two things occur. First, an interface oxide barrier is made to grow and it grows at a rate determined by the partial pressure of the particular oxidant in the ambient. Secondly, the number of dopant atoms from the doped oxide reaching the semiconductor surface is altered by the growth of the interface oxide barrier. This permits the use of a single prefabricated or standard doped oxide coating to form any desired surface concentration. The desired surface concentration of the dopant in the substrate is finally dependent upon the partial pressure of the oxidant in the ambient. It is also a significant finding of this invention that neither the thickness of the doped oxide nor its doping level affects the growth of the interface oxide. Thus, interface oxide growth is essentially independent of the doped oxide. This adds considerable flexibility to the doping process to be described by reducing the number of parameters which must be considered in controlling surface doping concentration. It will be appreciated therefore that the process of providing surface doping concentrations from a standard doped oxide can be automated because varying surface concentrations can be obtained from a single standard highly doped oxide layer on top of the substrate by varying the partial pressure of the oxidizing portion of the ambient. The surface concentrations thus can be accurately controlled by the control of the growth rate of the interface oxide barrier which is controlled by the partial pressure of the oxidant in the ambient.

A perhaps better understanding of the invention can be obtained by referring to the article by M. L. Barry and P. Olafsen in the Journal of the Electrochemical Society, vol. 16, No. 6, at p. 885, in which the following formula is derived for the surface concentration of the substrate material when doped oxides are used as diffusion sources. This formula is as follows:

$$C_2(x,t)=\frac{C_0\sqrt{D_1/D_2}}{(1+k)}\operatorname{erfc}\left[\frac{x_B+mkx}{2\sqrt{D_1t}}\right]$$

where $C_2$ is the surface dopant concentration, $C_0$ is the concentration in the doped oxide, $D_1$ is the diffusion coefficient of the dopant in the doped or undoped oxide, $D_2$ is the diffusion coefficient in the substrate $$k=\frac{1}{m\sqrt{D_1/D_2}}$$

(where $m$ is the segregation coefficient of the dopant at the substrate-oxide interface), $x_B$ is the thickness of the barrier oxide, and $t$=time. In the above equation, no attempt is made to vary $x_B$ which is the width of the undoped oxide. It is a feature of this invention that $x_B$ is varied by the utilization of an oxidizing ambient by varying the partial pressure of the oxidant within the diffusion chamber. As mentioned hereinbefore, this results in two advantages. The first is that the doping concentration $C_0$ in the doped oxide can be kept high and constant, the final surface concentration being dependent only on the width $x_B$ as varied by the aforementioned use of the oxidizing atmosphere. The second advantage is that the growth rate of the $x_B$ term is essentially independent of the thickness and doping concentration of the doped oxide. From experimental evidence, the growth rate proceeds as if the doped oxide did not exist, for all practical purposes.

Thus, the above formula can be used to approximate the final surface doping concentration, assuming the normal growth rate of an oxide on a substrate in an oxidizing atmosphere with the doped oxide layer assumed to be infinitely thin.

It is therefore a feature of this invention to vary the width of the undoped oxide in a predictable manner so that a standard doped-oxide coating can be used in an automated process to produce varying surface concentrations in the substrate.

SUMMARY OF THE INVENTION

It is therefore an object of this invention to utilize an oxidizing ambient in a doped oxide diffusion source process in which the surface concentration is a function of the partial pressure of the oxidant in the diffusion environment.

It is a further object of this invention to provide an improved method for the control of surface dopant concentration in a semiconductor substrate when doped oxides are used as diffusion sources by including in the ambient utilized in this process, a quantity of oxidant which causes an interface oxide utilized to control the doping concentration to grow at a predetermined rate, thereby controlling surface concentration of the dopant by control of the partial pressure of the oxidant in the ambient.

It is a still further object of this invention to provide an improved method for doping a semiconductor substrate by use of a doped oxide in which the diffusion takes place in an oxidizing atmosphere.

It is yet another object of this invention to utilize the growth of an interface oxide to control the surface doping concentration of a semiconductor substrate in a process which utilizes a doped oxide with a standard doping level.

Other objects of this invention will be better understood when considered in conjunction with the following drawings.

BRIEF DESCRIPTION OF THE INVENTION

Figure 1:
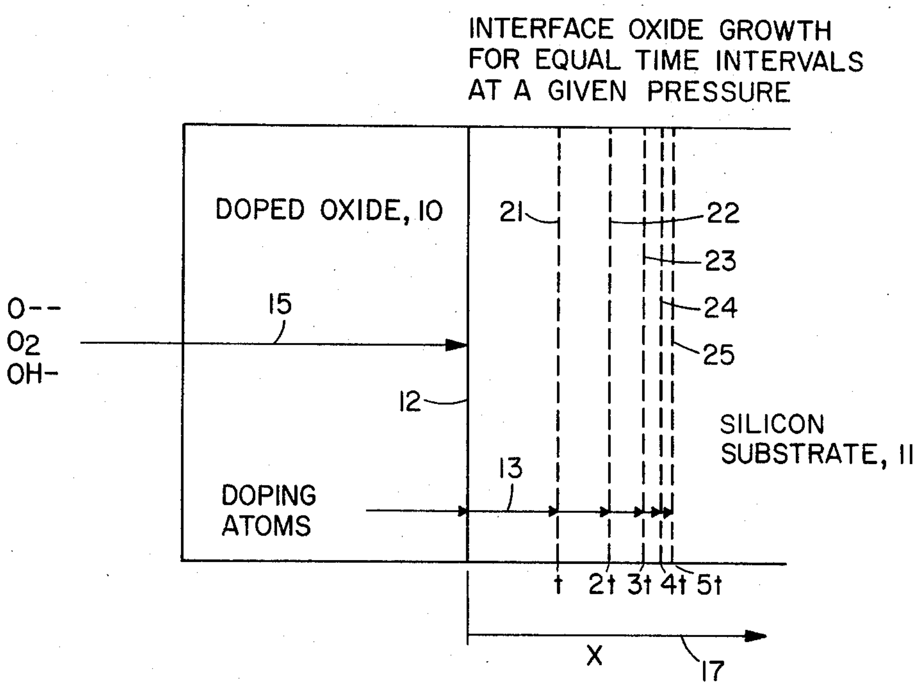
FIG. 1 is a drawing showing the growth of an interface oxide barrier during diffusion of a dopant into a silicon substrate from a doped oxide diffusion source in an oxidizing ambient.

There is disclosed a method of controlling surface dopant concentration in a semiconductor material in which the dopant is diffused from a doped oxide source. The method involves the use of an oxidizing ambient during the doping operation which creates a growing interface oxide barrier to moderate the doping of the substrate. Control of the process is obtained by adjusting the partial pressure of the oxidant and by controlling the amount of time the semiconductor material is kept in the diffusion chamber. This process permits the use of a standard highly doped oxide coating to achieve different and controllable surface concentrations of dopants diffused from the doped oxide into the semiconductor material by controlling the rate of growth of the interface oxide barrier which results from the use of the oxidizing ambient.

DETAILED DESCRIPTION OF THE INVENTION

As mentioned hereinbefore, in the prior art, no attempt is made at increasing the interface oxide barrier thickness when a doped oxide source is utilized with an undoped oxide barrier for the diffusion of a dopant into a substrate material. It is the primary function of the method described herein to utilize an oxidizing atmosphere such that when the substrate coated with the doped oxide layer is subjected to a heating step, either an interface oxide barrier forms and grows or an already deposited interface oxide barrier grows. The interface oxide itself operates as a moderator in that it reduces the number of doping atoms in the doped oxide reaching the substrate. If the interface oxide is sufficiently thick, no doping atoms reach the substrate. Coming back from the point at which no doping atoms reach the substrate, it has been found that by varying the thickness of the interface oxide, a varying number of atoms reach the oxide-substrate interface thus providing control over the surface doping concentration of the substrate. The thickness of the interface oxide is controlled by the partial pressure of the oxidant in the atmosphere at the exposed surface of the doped oxide. This atmosphere is any oxidizing species which causes the substrate to react to form an oxide interface. Although this invention will be described in terms of a monocrystalline silicon substrate and a silicon dioxide interface oxide, the invention is not limited to either silicon substrates or silicon oxides since the interface oxide control is the same for all oxidizable substrates. Most frequently used oxidizing atmospheres are oxygen and steam although other oxidizing atmospheres such as $N_2O$, NO and $O_3$ are clearly within the scope of this invention.

The rate of growth of the interface oxide is determined by the partial pressure of the oxidant. If the interface oxide grows faster than the diffusion rate of the dopant through the interface oxide, no doping of the substrate occurs. On the other hand when the rate of growth of the interface oxide is less than the diffusion rate of the dopant through the interface oxide, then at least some doping atoms from the doped oxide diffuse through the interface oxide to the substrate surface. The number of doping atoms which reach the substrate surface is thus a function of the rate of interface oxide growth. This can be seen diagrammatically in FIG. 1 in which a doped oxide layer 10 is provided on a substrate 11 which in this case is made of monocrystalline silicon. The original interface between the doped oxide layer 10 and the substrate 11 is shown by the vertical line 12. If the doped oxide and the substrate are heated, there is a diffusion of the doping atoms from the doped oxide towards the right as shown by the arrows 13. If the exposed face of the doped oxide layer 10 is exposed to an oxidant in gaseous form, the oxidant diffuses so rapidly through the doped oxide (as shown by the arrow 15) it is as if the doped oxide did not exist. Thereafter, the oxidant proceeds to react with, in this case, silicon to form a silicon dioxide interface layer in the direction of the arrow 17 which defines the $x$ direction and which defines the zero point as the original interface 12. At a time $t$, the oxide growth will have proceeded to the dotted line 21; at a time $2t$ to the dotted line 22; at a time $3t$ to the dotted line 23; at a time $4t$ to the dotted line 24 and at a time $5t$ to the dotted line 25. The reason for the decreasing growth with repect to the equal time intervals is that the oxide formed in the previous time interval reduces the diffusion of the oxidant to the siilcon substrate 11. Thus, as more interface oxide is built up, it becomes increasingly difficult for the oxidant to penetrate to the substrate and the interface oxide growth slows down. As the new interface oxide is grown, this new oxide moderates the rate at which the dopant atoms penetrate to the silicon oxide interface. This moderation is controlled by the aforementioned growth rate of the interface oxide. Even if the growth rate of the oxide is less than the diffusion rate of the dopant in the doped oxide, it becomes more difficult for the doping atoms to penetrate the increased thickness of the oxide and thus the surface doping level of the silicon substrate is decreased from that which occurs if no new interface oxide were grown.

In general, the slowest formation of the interface oxide is accomplished with molecular oxygen. The use of steam appears to be the oxidizing agent which affords the most rapid growth of interface oxide. Depending on the dopant used to dope the doped oxide layer 10, it will be apparent that in some cases the steam stimulates such a rapid growth of the interface oxide that it exceeds the diffusion rate of the doping atoms through the interface oxide. In this case, either the partial pressure of the oxidant must be reduced so as to reduce the growth rate of the interface oxide or another oxidant must be utilized in order that at least some doping of the substrate occurs.

While it is not within the scope of this invention to describe the various ways in which doped oxide may be applied to a substrate, it will be apparent that oxides doped with any of the common dopants such as arsenic, phosphorous, boron, antimony, indium, gallium, zinc, etc. may be utilized. The manner in which the control of the surface dopant concentration in the substrate is obtained is now described.

Figure 2:
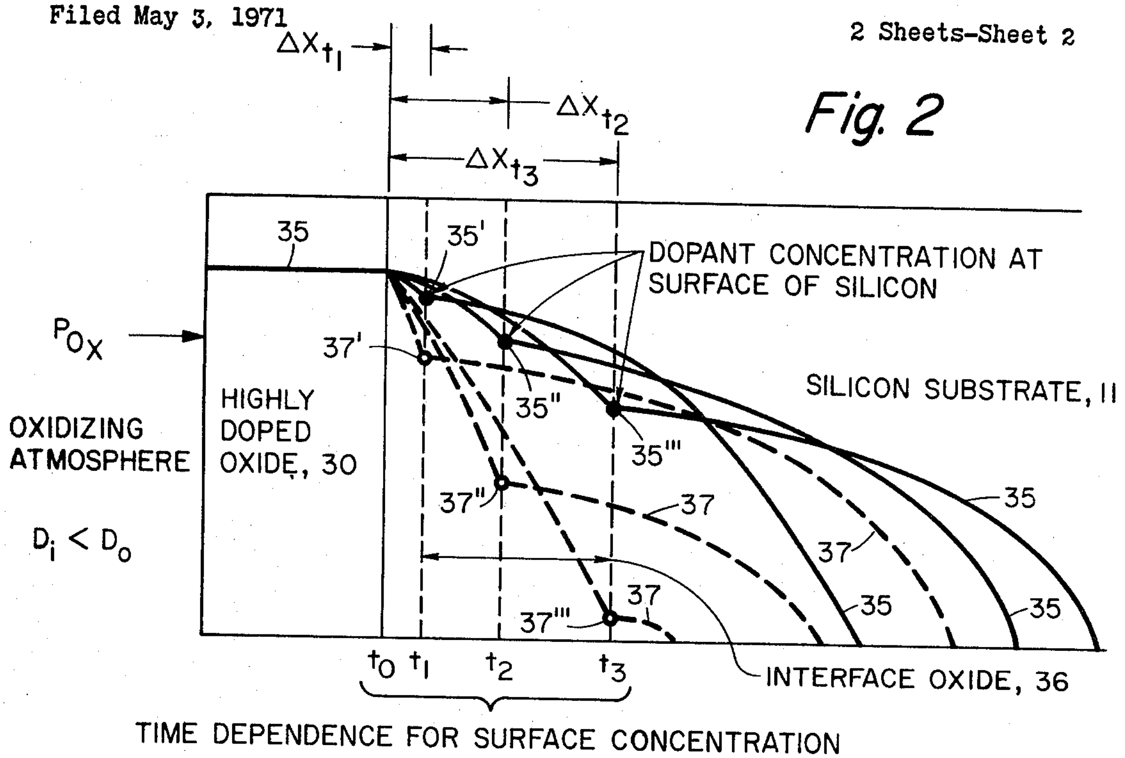
FIG. 2 is a diagram showing surface dopant concentrations and the time dependence of this concentration when oxidizing atmosphere used in a doped oxide diffusion source process is maintained at a constant partial pressure.
Figure 3:
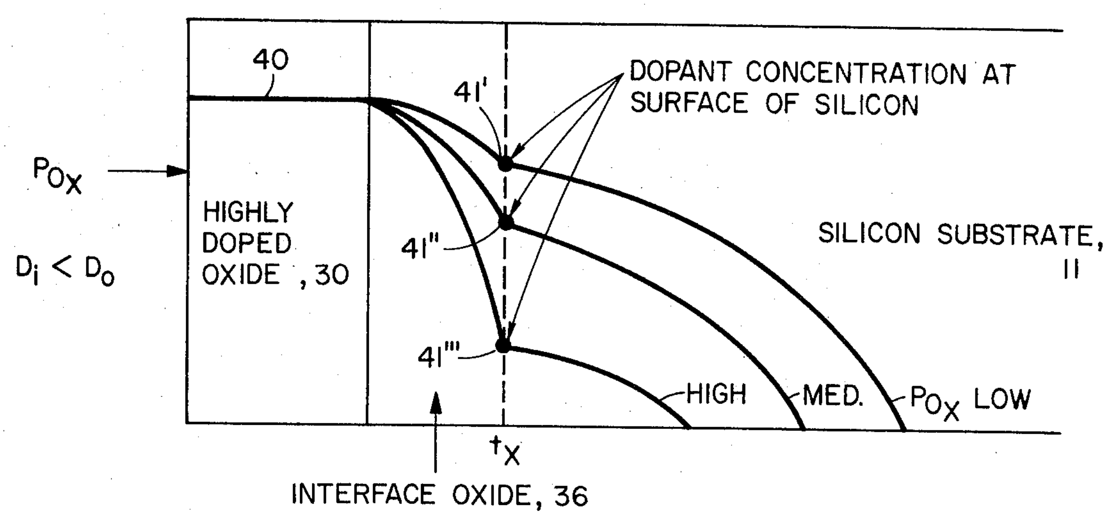
FIG. 3 is a diagram showing surface dopant concentration as a function of the partial pressure of the oxidant in the oxidizing atmosphere wherein the exposure time is constant.

It should be noted that the following graphs indicate the aforementioned growth of the interface oxide. Interface oxide growth is a sole function of the substrate utilized, the oxidizing atmosphere, the temperature involved and the partial pressure of the oxidant in the atmosphere. FIG. 2 shows a time dependence in which partial pressure of the oxidant is kept constant while FIG. 3 shows the pressure dependence in which the exposure time is kept constant.

Referring to FIG. 2, there is shown the time dependence of the surface concentration when a substrate 11 is provided with the highly doped oxide layer 30. Substrate 11 is most usually monocrystalline silicon. Other oxidizable substrates such as germanium are also considered within the scope of this invention when used in combination with appropriate oxidizing atmospheres. The dopant concentration both in the highly doped oxide layer and in the silicon substrate 11 is shown by the lines 35. The substrate and the doped oxide layer are both heated above that temperature at which doping atoms in the oxide start to diffuse into the silicon substrate 11. This temperature may vary from material to material. In the case of a particular silicon substrate and a phosphorus doped oxide with a constant partial pressure for the oxidant the surface doping concentration is shown by the points 35', 35'' and 35''', corresponding to times $t_1$, $t_2$ and $t_3$. As can be seen from this figure, the interface oxide 36 is allowed to grow. The width of this oxide is denoted respectively by the characters $\Delta X_{t_1}$, $\Delta X_{t_2}$ and $\Delta X_{t_3}$. It will be appreciated that in this case the surface concentrations shown at 35', 35'' and 35''', are decreasing with an increase in time and therefore an increase in the interface oxide thickness.

It will be appreciated that in the graph shown in FIG. 1, several initial conditions apply. First the pressure is kept constant and secondly the growth rate of the oxide is less than the diffusion rate of the particular dopant used through the oxide. If the growth rate of the interface oxide is denoted by the symbol $D_i$ and the diffusion rate of the dopant in the interface oxide is denoted by $D_o$, then the ratio of $D_o/D_i$ must be greater than 1 to have any doping of the substrate whatever. However, the ratio of $D_o/D_i$ also determines, to a first approximation, the surface concentration for given time intervals. Referring back to FIG. 2, the doping concentrations 35', 35'' and 35''' for times $t_1$, $t_2$ and $t_3$ refer to a given ratio of $D_o$ to $D_i$. In this case the dopant is phosphorus. If the dopant had been boron, $D_o$ would have been lower indicating a slower diffusion through the oxide. The graph in FIG. 2 shows points 37', 37'' and 37''' indicating the dopant concentrations for this slower diffusing dopant under the same initial conditions and the same time intervals. Thus, if $D_o<D_i$ there will be no surface doping because the interface oxide will be growing faster than the diffusion through it. If $D_o=D_i$ there will be no change in surface dopant concentration over time since there will be matched growth and diffusion rates. If, as shown in FIG. 2, $D_o>D_i$, then as $t$ increases the surface concentration will decrease. The ratio of $D_o/D_i$ therefore, determines the surface concentration over given time intervals. Since $D_o$ and $D_i$ are known, the ultimate control over the surface concentration, with the partial pressure constant, is the exposure time. Thus by utilizing an oxidizing atmosphere at a constant pressure with a predetermined ratio of growth rate to diffusion rate, the concentration of the dopant at the surface of the silicon substrate can be controlled purely by controlling the exposure time of the substrate to both heat and the oxidizing atmosphere. It will be noted that in FIG. 2, the height of the lines 35 and 37 represent the doping concentrations in the doped oxide 30, the interface oxide 36 and the substrate 11.

The following tables are illustrative of several experimental surface concentrations as a function of time for oxides doped with phosphorus, boron and arsenic. It will be appreciated that other common dopants such as antimony, gallium and indium can also be used. In each case, the partial pressure of the oxidant was kept constant and at the level indicated.

TABLE I

Surface doping concentration. Dopant: Phosphorus

| Temp., ° C. | Oxidant | Partial pressure atmosphere | Minutes: 4 | 16 | 36 | 64 |
|---|---|---|---|---|---|---|
| 1100 | $O_2$ | 1 | $2.0\times10^{19}$ | $1.4\times10^{19}$ | $8.0\times10^{18}$ | $6.0\times10^{17}$ |
| 1100 | $H_2O$ | 1 | $2.6\times10^{18}$ | $1.1\times10^{18}$ | $5.4\times10^{17}$ | $3.2\times10^{18}$ |

NOTE.—Substrate: [111] Monocrystalline silicon. Initial substrate doping concentration: $10^{15}$ atoms/cm.$^3$. Doping concentration of doped oxide: $1.2\times10^{40}$ atoms/cm.$^3$.

TABLE II

Surface doping concentration. Dopant: Boron

| Temp., ° C. | Oxidant | Partial pressure atmosphere | Minutes: 4 | 16 | 36 | 64 |
|---|---|---|---|---|---|---|
| 1,100 | $O_2$ | 1 | $8.8\times10^{19}$ | $5.1\times10^{19}$ | $3.2\times10^{19}$ | $1.2\times10^{19}$ |
| 1,100 | $H_2O$ | .33 | $4.7\times10^{18}$ | $2.7\times10^{18}$ | $1.7\times10^{18}$ | $0.65\times10^{18}$ |

NOTE.—Substrate: [111] Monocrystalline silcon. Initial substrate doping concentration: $10^{15}$ atoms/cm.$^3$. Doping concentration of doped oxide: $3.4\times10^{20}$ atoms/cm.$^3$.

TABLE III

Surface doping concentration. Dopant: Arsenic

| Temp., ° C. | Oxidant | Partial pressure atmosphere | Minutes: 4 | 16 | 36 | 64 |
|---|---|---|---|---|---|---|
| 1,100 | $O_2$ | 1 | $1.2\times10^{20}$ | $8.5\times10^{19}$ | $5.8\times10^{19}$ | $4.7\times10^{19}$ |
| 1,100 | $H_2O$ | 1 | $2.0\times10^{19}$ | $1.5\times10^{19}$ | $1.0\times10^{19}$ | $7.0\times10^{18}$ |

NOTE.—Substrate: [111] Monocrystalline silicon. Initial substrate doping concentration: $10^{15}$ atoms/cm.$^3$. Doping concentration of doped oxide: $1.6\times10^{20}$ atoms/cm.$^3$.

Referring now to FIG. 3, the pressure dependence of the dopant concentration in the doped oxide 30, the interface oxide 36 and the substrate 11 is shown by the line 40. The points 41', 41'' and 41''' indicate the surface concentration of the dopant for different partial pressures. In this case, each of the curves 41', 41'', and 40''' are normalized to a single time $t_x$ after heat and the oxidizing ambient are applied. It will be appreciated that in this particular configuration the diffusion rate of the doping atoms is greater than the growth rate of the interface oxide 36 such that some doping of the substrate 11 occurs. As can be seen, the highest doping concentration, denoted by the point 41', is obtained with a low partial pressure for the oxidant. A medium partial pressure for the oxidant results in a medium surface concentration shown by the point 41''. The lowest dopant concentration is obtained for a high partial pressure as shown by the point 41'''. This is because although the diffusion rate through the oxide is to some extent heightened by an increase in ambient pressure, the increase in growth rate of the oxide occasioned by this increase in ambient pressure far exceeds the increase in diffusion rate. Thus, by increasing the partial pressure of the oxidant, the surface concentration is reduced. This is shown more clearly in the following examples in which a highly doped oxide layer 30, doped with phosphorus, boron and arsenic is subjected to step increases in the partial pressure of the oxidant.

TABLE IV

Surface doping concentration. Dopant: Phosphorus

| Oxidant | 1 atm. | ¾ atm. | ½ atm. | ¼ atm. | 0 atm. |
|---|---|---|---|---|---|
| $Q_2$ | $1.6\times10^{19}$ | $2.1\times10^{19}$ | $3.3\times10^{19}$ | $9\times10^{19}$ | $1.2\times10^{20}$ |
| $H_2O$ | $1.1\times10^{18}$ | $1.3\times10^{18}$ | $1.9\times10^{18}$ | $3.5\times10^{18}$ | $1.2\times10^{20}$ |

NOTE.—Time: 16 minutes. Temperature: 1,100° C.

TABLE V

Surface doping concentration. Dopant: Boron

| Oxidant | 1 atm. | ¾ atm. | ½ atm. | ¼ atm. | 0 atm. |
|---|---|---|---|---|---|
| $O_2$ | $8.0\times10^{19}$ | $1.0\times10^{20}$ | $1.4\times10^{20}$ | $2.1\times10^{20}$ | $3.4\times10^{20}$ |
| $H_2O$ | (1) | (1) | (1) | $8.0\times10^{18}$ | $3.4\times10^{20}$ |

[1] No doping $D_o<D_o$.

NOTE.—Time: 16 minutes. Temperature: 1,100° C.

TABLE VI

Surface doping concentration. Dopant: Arsenic

| Oxidant | 1 atm. | ¾ atm. | ½ atm. | ¼ atm. | 0 atm. |
|---|---|---|---|---|---|
| $H_2O$ | $3.0\times10^{18}$ | $7.0\times10^{18}$ | $1.5\times10^{19}$ | $3.7\times10^{19}$ | $9.0\times10^{19}$ |

NOTE.—Time: 16 minutes. Temperature: 1,100° C.

In practice the partial pressure of the oxidant is changed by changing the relative percentages of the oxidant in a neutral carrier gas. For oxygen the neutral carrier gas can be nitrogen such that the total ambient is kept at, for instance, one atmosphere and the percentage of oxygen changed to vary the partial pressure.

As can be seen, the surface concentration can be varied either by varying the time during which the substrate is exposed to heat and the oxidizing ambient; or it can be varied by varying the partial pressure of the oxidant in the ambient. These two techniques yield an extremely automatable process such that the doped oxide layer 30 need not be changed in order to change the surface doping concentration of the substrates used. The only parameter varied is either the time or the partial pressure of the oxidant. The important factor which enables the use of a standard doped oxide for all surface doping situations is the use of an oxidant in the ambient surrounding the doped oxide. The control of either the pressure or the exposure time varies the oxide growth rate to achieve the desired surface concentration. By utilizing an oxidant containing ambient, the necessity of providing different concentrations in the doped oxides utilized in a diffusion process is eliminated.

It will be appreciated that in the case of doping integrated circuits certain portions of the circuit must have differing doping levels. This is quite easily accomplished by the subject method by selectively masking all areas except those requiring a given doping level. These areas are then doped at one partial pressure in the prescribed manner. The mask is then repatterned over different areas, and the aforementioned partial pressure is changed thus changing the surface concentration at the newly exposed areas without changing or removing the doped oxide.

It will be apparent that the mechanism for surface concentration control is the control of the growth of the interface oxide. The interface oxide grows because of the use of an oxidizing ambient. Thus it is within the broad scope of this invention that any oxidizable substrate can be used with a corresponding oxidizing atmosphere applied through the doped oxide. Surface doping concentrations can be obtained empirically or to a first approximation by use of the aforementioned formulas and known oxidation rates for the materials involved. What makes the latter computations somewhat less complicated is the finding that the thickness and the doping level of the doped oxide have very little practical effect on the interface oxide barrier growth rate.

By whatever means the final surface doping concentrations are calculated, once the parameters of time and partial pressure have been established a standard "off the shelf" doped oxide is used to provide a wide variety of surface concentrations, for a variety of semiconductor applications.

What is claimed is:

1. In a method for diffusing doping atoms from a doped oxide layer on top of a semiconductor substrate in which the layer and substrate are heated so as to cause said diffusion, the steps of:

providing an oxidizing atmosphere at the exposed surface of said doped oxide layer, said oxidizing atmosphere passing through said doped oxide layer and oxidizing said substrate such that an oxide layer grows at the interface between said doped layer and said substrate, and controlling the rate of growth of said interface oxide layer so as to control the concentration of said doping atoms at the surface of said substrate which abuts said growing interface oxide layer.

2. The method as recited in claim 1 wherein said growth rate and the subsequent doping concentration at said substrate surface is controlled by the partial pressure of the oxidant in said oxidizing atmosphere.

3. The method as recited in claim 1 wherein said growth rate and the subsequent doping concentration at said substrate surface is controlled by the time that said doped layer and substrate is subjected to heat and said oxidizing atmosphere.

4. The method as recited in claim 1 wherein the dopant concentration at said substrate surface is maintained at a uniform level by controlling the partial pressure of said oxidant to that point at which said growth rate equals the rate of diffusion of said doping atoms through said growing oxide layer.

5. The method as recited in claim 1 wherein from a doped oxide layer having a predetermined dopant concentration level a variety of different dopant concentrations are provided at different locations on the surface of said substrate further including the steps of:

masking said substrate so as to provide apertures at a first set of locations on the surface thereof;

diffusing said dopant into said substrate under a first set of operating conditions, one parameter in said first set being a first partial pressure for the oxidant in said oxidizing atmosphere;

remasking said substrate so as to provide apertures at a different set of locations on the surface of said substrate; and diffusing said dopant into said substrate under a second set of operating conditions, said second set of operating conditions varying from said first set in the magnitude of said partial pressure, whereby said substrate is provided with different surface dopant concentrations at said different sets of locations.

6. The method as recited in claim 5 wherein said partial pressures remain constant and said first and second set of operating conditions are made different with respect to the times that said substrate and said doped oxide are exposed to said temperature and said oxidizing atmosphere.

7. The method as recited in claim 1 wherein said doped oxide layer is highly doped and further including the steps of:

providing said highly doped oxide over a multiplicity of individual substrates, and controlling the partial pressure of the oxidant in said oxidizing atmosphere over each of said substrates so as to control the doping concentration at the surfaces of each of said substrates by varying the partial pressure thereabove, whereby each of said substrates may be provided with different surface concentrations from said highly doped oxide.

8. The method as recited in claim 1 wherein said substrate is a monocrystalline semiconductor material and said oxidizing atmosphere is selected from the group consisting of $O_2$, $H_2O$, NO and $O_3$.

9. The method as recited in claim 8 wherein said monocrystalline semiconductor material is silicon and said interface oxide layer is silicon dioxide.

10. The method as recited in claim 1 wherein the growth rate of said interface oxide is less than the diffusion rate of the doping atoms in said doped oxide through said interface oxide.

References Cited

UNITED STATES PATENTS

| | | | |
|---|---|---|---|
| 3,574,009 | 4/1971 | Chizinsky et al. | 148—187 |
| 3,312,577 | 4/1967 | Dunster et al. | 148—187 |
| 3,001,896 | 9/1961 | Marinace | 148—188 |
| 2,974,073 | 3/1961 | Armstrong | 148—188 |
| 2,879,190 | 3/1959 | Logan et al. | 148—188 |
| 2,873,222 | 2/1959 | Derick et al. | 148—1.5 |

GEORGE T. OZAKI, Primary Examiner

U.S. Cl. X.R.

148—186, 187